United States Patent
Kang et al.

(10) Patent No.: US 8,758,852 B2
(45) Date of Patent: Jun. 24, 2014

(54) METHOD FOR PATTERNING NANOMATERIAL USING SOLUTION EVAPORATION

(75) Inventors: Jeung-Ku Kang, Daejeon (KR); Kyung-Min Choi, Daejeon (KR); Jung-Hoon Choi, Daejeon (KR); Weon-Ho Shin, Daejeon (KR); Jung-Woo Lee, Daejeon (KR); Hyung-Mo Jeong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 407 days.

(21) Appl. No.: 13/140,879

(22) PCT Filed: Feb. 3, 2009

(86) PCT No.: PCT/KR2009/000525
§ 371 (c)(1),
(2), (4) Date: Jun. 20, 2011

(87) PCT Pub. No.: WO2010/074365
PCT Pub. Date: Jul. 1, 2010

(65) Prior Publication Data
US 2011/0256316 A1      Oct. 20, 2011

(30) Foreign Application Priority Data

Dec. 22, 2008  (KR) ......................... 10-2008-0131413

(51) Int. Cl.
*B05D 1/32*      (2006.01)
*B82Y 10/00*    (2011.01)

(52) U.S. Cl.
USPC ........... 427/212; 427/287; 427/256; 977/748; 977/773

(58) Field of Classification Search
USPC ................................................. 427/256, 287
See application file for complete search history.

(56) References Cited

U.S. PATENT DOCUMENTS

| 2002/0046872 A1* | 4/2002 | Smalley et al. ............ 174/137 A |
| 2005/0031526 A1* | 2/2005 | Clarke ........................ 423/447.1 |
| 2006/0057053 A1* | 3/2006 | Otobe et al. ............... 423/447.2 |
| 2007/0275627 A1 | 11/2007 | Jung et al. |

FOREIGN PATENT DOCUMENTS

| JP | 2007-069282 A | 3/2007 |
| JP | 2007-152514 A | 6/2007 |
| JP | 2007-536101 A | 12/2007 |
| KR | 10-2007-0113841 A | 11/2007 |
| WO | WO 2006/041535 A2 | 4/2006 |

OTHER PUBLICATIONS

International Search Report [translated] mailed on Jan. 25, 2010 for International Appl. No. PCT/KR2009/000525, ISA/Korean Intellectual Property Office, Republic of Korea, 2 pages.
English language translation [Unverified] of Japanese Patent Appl. No. JP 2007-069282 A, espacenet Database, 1 page.
English Language translation [Unverified] of Japanese Patent Appl. No. JP 2007-152514 A, espacenet Database, 1 page.

* cited by examiner

*Primary Examiner* — Nathan Empie
*Assistant Examiner* — Francisco Tschen
(74) *Attorney, Agent, or Firm* — Sterne, Kessler, Goldstein & Fox P.L.L.C.

(57) ABSTRACT

Disclosed is a method for patterning a nanomaterial using solution evaporation. More particularly, the method for patterning a nanomaterial using solution evaporation includes; coating the nanomaterial with a polymer material and uniformly dispersing the coated nanomaterial in a solvent to prepare a solution containing the nanomaterial, and pouring the nanomaterial-containing solution on a substrate, enabling the nanomaterial to be patterned after evaporation of the solvent.

6 Claims, 4 Drawing Sheets

METHOD FOR PATTERNING NANOMATERIAL USING SOLUTION EVAPORATION

RELATED APPLICATIONS

This application claims priority from Korean Patent Application No. 2008-131413, filed on Dec. 22, 2008 in the Korean Intellectual Property Office, the entire disclosure of which is incorporated herein by reference.

BACKGROUND OF THE INVENTION

1. Field of the Invention

The present invention relates to a method for patterning a nanomaterial using solution evaporation and, more particularly, to a method for patterning a nanomaterial through solution evaporation, which includes coating the nanomaterial with a polymer material and uniformly dispersing the coated nanomaterial in a solvent to prepare a nanomaterial-containing solution, and pouring the nanomaterial-containing solution on a substrate to allow the nanomaterial to be patterned after solvent evaporation.

2. Description of the Related Art

With recent progress in miniaturization and/or integration of optic and electronic elements, extensive studies into not only nano-structural materials and preparation thereof but also utilization thereof have actively been conducted. In particular, for a nano-sized material having different electrical, optical and/or magnetic features from those of a bulk-sized material, studies into artificial arrangement or patterning (hereinafter, referred to as "patterning") of nanomaterials, fabrication of elements, or the like, have actively been conducted over the world, in order to utilize the nano-sized material as a material for ultrafine electronic elements.

In order to use nanomaterials in a wide range of applications, a nanomaterial after preparation must be patterned in desired morphologies at desired sites. Also, in order to enable the foregoing techniques to be utilized in industrial applications, a simple process of easily, rapidly and conveniently patterning nanomaterials is strongly needed. However, it is still difficult to pattern nanomaterials with a desired shape and/or size in a desired direction. That is, patterning of a nanomaterial requires very complicated and difficult processes, as well as a long processing time and high processing costs.

Photolithographic techniques are based on a principle that, when a specific photoresist receives light, a chemical reaction occurs to modify inherent properties of the photoresist and, more particularly, involve a series of complicated processes including; depositing a film on a substrate and applying photoresist thereto, selectively exposing the photoresist using UV wavelength, developing the exposed photoresist, etching the film using the developed photoresist as a mask, and releasing the photoresist. Accordingly, due to not only complicated and cumbersome stages but also requirement of various apparatuses, such apparatuses may occupy a large installation area and processing time and costs may be increased.

Other than such photolithographic techniques, ink-jet printing may be utilized to print a carbon nanotube material on a desired region, in turn patterning carbon nanotubes. However, it is difficult to prepare a uniform nanotube material using a solution type carbon nanotube material. Also, owing to fluidity of the carbon nanomaterial, the carbon nanomaterial does not have a constant and desired shape but flows, therefore, needs an additional process such as alternative patterning process to form a barrier, or the like.

Alternative methods, for example, dip-pen nanolithography such that a part of the substrate to be patterned is functionalized using a substance compatible with a nanomaterial and such a nanomaterial is adhered to the functionalized part, micro-contact printing, or the like, have been suggested, however, have not yet been employed in industrial applications due to high processing costs.

Therefore, there is a strong need to develop an improved patterning method of a nanomaterial using solution evaporation, in turn allowing the nanomaterial to be more easily, rapidly and simply patterned.

SUMMARY OF THE INVENTION

The present inventors have continuously studied patterning of various nanomaterials such as carbon nanotubes, titanium oxide nanotubes, nanoparticles, etc., and found that a simple and easy method for patterning a nanomaterial, capable of controlling shapes and/or sizes of nanomaterials may be achieved for application and industrial use of nanomaterials, thus completing the present invention.

Accordingly, the present invention is directed to solve problems of conventional art described above and an object of the present invention is to provide a method of patterning a nanomaterial using solution evaporation that includes; controlling surface properties and behaviors of the nanomaterial using a polymer material at a temperature of more than a melting point of the polymer material, then, using a solution synthesized from the foregoing process and evaporation thereof, to thereby pattern the nanomaterial with desired shape and size.

In order to accomplish the foregoing abject, according to an embodiment of the present invention, there is provided a method for patterning a nanomaterial using solution evaporation including: coating the nanomaterial with a polymer material and uniformly dispersing the coated nanomaterial in a solvent to prepare a solution containing the nanomaterial; and pouring the nanomaterial-containing solution on a substrate to allow the nanomaterial to be patterned after solvent evaporation, thereby enabling patterning of the nanomaterial with controlled shape and size or, otherwise, with desired shape and size.

A method for patterning a nanomaterial using solution evaporation according to the present invention may be employed in patterning various types of nanomaterials and, by altering a concentration of a solution containing the nanomaterial and/or a shape of an evaporation guide, a pattern concentration and/or shape may be controlled. In addition, the inventive method may include preparing a nanomaterial-containing solution then patterning the nanomaterial using solution evaporation, thereby allowing a variety of nanomaterials to be easily, rapidly and simply patterned.

BRIEF DESCRIPTION OF THE DRAWINGS

The above and other objects, features and other advantages of the present invention will be more clearly understood from the following detailed description taken in conjunction with the accompanying drawings, in which:

FIG. 1A shows a process of patterning carbon nanotubes through self-pinning by adding a carbon nanotube-containing solution by droplets to a substrate, on which a bar shape evaporation guide is provided, while evaporating the solution in the same shape as the evaporation guide, and FIG. 1B shows a process of patterning carbon nanotubes along a shape of the evaporation guide through compulsive pinning by adding a carbon nanotube-containing solution by droplets to a substrate surrounded by the evaporation guide, while evaporating the solution only along a peripheral side of the evaporation guide.

FIG. 2A is an SEM image showing carbon nanotubes periodically patterned in a straight line form, FIG. 2B is an enlarged SEM image of a part shown in FIG. 2A, FIG. 2C is an SEM image showing carbon nanotubes patterned in a concentric form, and FIG. 2D is an enlarged SEM image of a part shown in FIG. 2C.

FIG. 3A is an SEM image showing carbon nanotubes periodically patterned in a 'U' shape, FIG. 3B is an SEM image showing carbon nanotubes periodically patterned in a 'U' shape, FIG. 3C is an SEM image showing carbon nanotubes patterned in a shape of the word 'NANO, ' and FIG. 3D is an enlarged SEM image of a white square part in the word 'NANO' shown in FIG. 3C.

FIG. 4A is an SEM image showing metal-doped carbon nanotubes patterned using solution evaporation, FIG. 4B is an enlarged SEM image of a part shown in FIG. 4A, FIG. 4C is an SEM image showing titanium oxide nanoparticles patterned using solution evaporation, FIG. 4D is an enlarged SEM image of a part shown in FIG. 4C, FIG. 4E is an SEM image showing titanium oxide nanotubes patterned using solution evaporation, and FIG. 4F is an enlarged SEM image of a part shown in FIG. 4E.

DETAILED DESCRIPTION OF THE INVENTION

Figure 1:
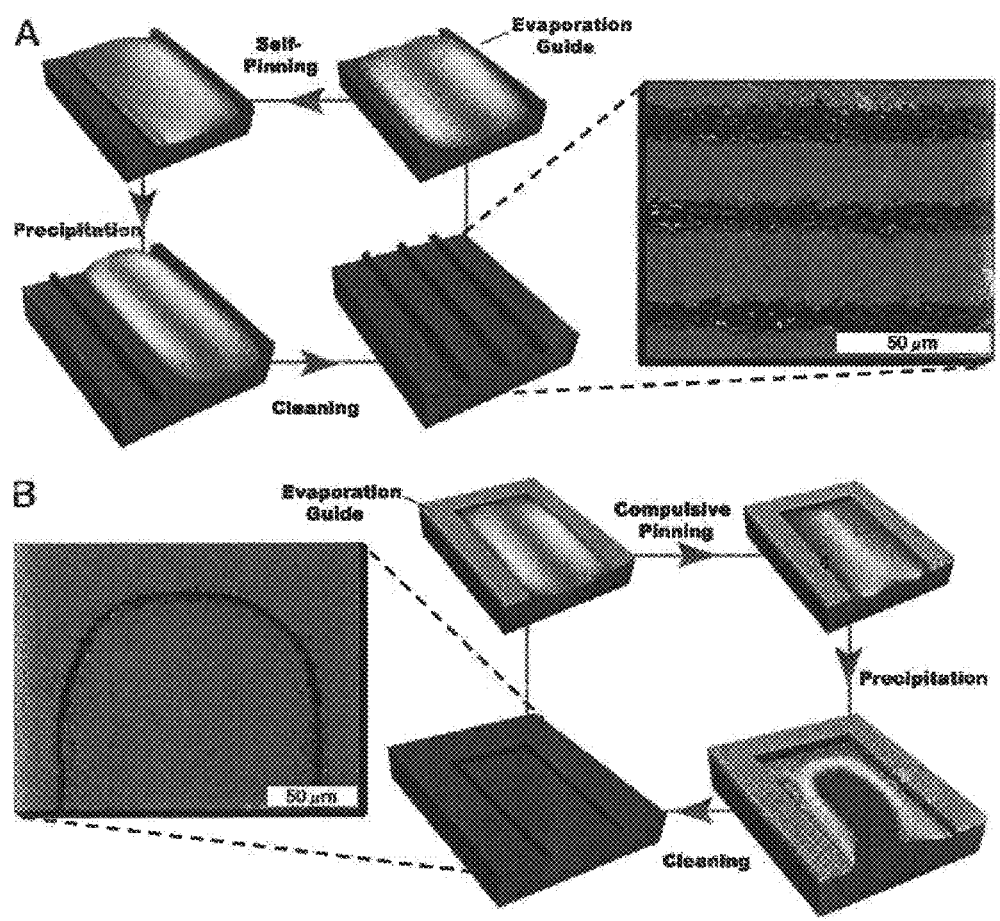
FIG. 1 is a diagrammatic view illustrating a process of patterning a nanomaterial using solution evaporation according to the present invention. In particular.

The present invention provides a method for patterning a nanomaterial using solution evaporation.

The method for patterning a nanomaterial using solution evaporation according to the present invention comprises: coating the nanomaterial with a polymer material and uniformly dispersing the coated nanomaterial in a solvent to prepare a solution containing the nanomaterial; and pouring the nanomaterial-containing solution on a substrate, enabling the nanomaterial to be patterned after evaporation of the solvent.

In this regard, the coating of a nanomaterial with the polymer material is performed by applying the polymer material to the nanomaterial, in order to inhibit agglomeration of the nanomaterial and allow the nanomaterial to have the same activity as that of the solvent.

The polymer material may be at least one selected from a group consisting of polyvinyl pyrrolidone (PVP), polystyrene, poly(vinyl acetate) and polyisobutylene.

The coating of nanomaterial with the polymer material may be performed by dissolving the polymer material in a solvent containing the nanomaterial dispersed therein and heating the solution at a high temperature.

Alternatively, the coating of a nanomaterial with the polymer material may be performed by dispersing the nanomaterial in a solution, adding the polymer material to the solution and heating the solution at a temperature of more than a melting point of the polymer material to thus enable the polymer material to be converted into a liquid state, in turn coating the dispersed nanomaterial.

In this case, the coating of a nanomaterial with the polymer material through heating may include, for example, a coating process comprising: dispersing the nanomaterial in 1,5-pentanediol and adding polyvinyl pyrrolidone (PVP) as the polymer material to the dispersion; first-heating the solution at 150 to 230° C. for 1 to 3 hours while agitating; and second-heating the resultant material by elevating the temperature to 250 to 300° C. for 30 minutes to 1 hour, thereby coating the nanomaterial with the polymer material.

A solvent in which the nanomaterial to be coated with the polymer material is dispersed, may be a solvent having a low boiling point, since the solvent is further evaporated and removed from the substrate.

The solvent in which the nanomaterial to be coated with the polymer material is dispersed, may be at least one solvent having a low boiling point, for example, selected from a group consisting of ethanol, acetone, benzene, ether and hexane.

The solvent in which the nanomaterial to be coated with the polymer material is dispersed, may be at least one solvent having a low boiling point, for example, selected from ethanol or acetone.

After pouring the nanomaterial-containing solution on the substrate, the solvent of the solution containing the nanomaterial should be removed from the substrate. Therefore, the substrate may be a substrate retaining a temperature around a boiling point of the solvent substrate and/or a substrate having a desired shape of an evaporation guide which enables the nanomaterial to be patterned in the same shape as described above.

The substrate used herein may include, for example, a substrate having an evaporation guide while being maintained at 40 to 80° C. That is, when a nanomaterial-containing solution is maintained at 40 to 80° C. and fed to a substrate having an evaporation guide, the nanomaterial-containing solution is introduced along a shape of the evaporation guide and then the solvent of the nanomaterial-containing solution is evaporated due to a temperature of the substrate, thereby enabling the nanomaterial to be patterned along the shape of the evaporation guide provided on the substrate. Accordingly, since the nanomaterial is patterned on the substrate along the shape of the evaporation guide provided on the substrate, if using an evaporation guide in a desired shape, the nanomaterial may be patterned along the foregoing shape.

The evaporation guide described above may be made of any substance having an unchangeable shape regardless of temperature. For example, at least one selected from a group consisting ceramic, glass and metal may be used.

The evaporation guide described above may have any one of shapes selected from straight line, curve, circle and angled shapes. Here, the angled shape means any geometrical figure having angles such as triangle, quadrangle, pentagon, hexagon, octagon, or the like.

The nanomaterial described above may include any one having nano-sized particles, without being particularly limited. For example, at least one selected from a group consisting of carbon nanotubes, metal-doped carbon nanotubes, titanium oxide nanoparticles and titanium oxide nanotubes may be used.

The nanomaterial to be patterned according to the foregoing is coated with the polymer material. Therefore, in order to pattern pure nanomaterial only, after removing the evaporation guide from the substrate, the substrate on which the nanomaterial is placed, may be sequentially immersed into methanol then ethanol for 30 to 60 seconds for each to selectively dissolve and remove the polymer material alone. The evaporation guide provided on the substrate may be separated and removed using a device such as tweezers.

With regard to a method for patterning a nanomaterial using solution evaporation according to the present invention, exemplary embodiments have been practically conducted using various components and under different conditions such as content of the components. According to such embodiments, in order to accomplish the purposes of the present invention, a method for patterning a nanomaterial using solution evaporation under the foregoing conditions is preferably provided.

Examples

Exemplary embodiments of the present invention are described in detail according to the following examples. However, such embodiments are proposed for illustrative purposes and the scope and spirit of the present invention disclosed in the appended claims are not restricted thereto.

Example 1

Patterning of Carbon Nanotubes Using Solution Evaporation (1) Preparation of a Dispersion Containing Carbon Nanotubes.

In order to prepare a solution containing carbon nanotubes coated with a polymer material, 4 mg of carbon nanotubes were placed in 50 ml of a 1,5-pentanediol solution and dispersed using a sonicator for 6 hours. The dispersion was moved to a round flask and 5.35 g of polyvinyl pyrrolidone (PVP) was added thereto. Then, the mixture was heated at 200° C. for 2 hours under stirring, further heated by elevating the temperature to 270° C. for 30 minutes, followed by decreasing the temperature. Next, a series of processes including washing the material with 150 ml of acetone, dispersing the washed material in 50 ml of ethanol and centrifuging the dispersion to isolate carbon nanotubes were repeated twice. Thereafter, the resultant carbon nanotubes were dispersed again in 20 ml of ethanol to obtain a solution containing the carbon, nanotubes coated with the polymer material. In the foregoing procedures, since the heating temperature exceeds a melting point of PVP, PVP is converted from a crystalline phase to a liquid state, thereby completely coating the carbon nanotubes dispersed therein. Owing to such coating, van-der-Waals interaction between carbon nanotubes is substantially eliminated whereas interaction between the carbon nanotubes and ethanol as a dispersing solvent is increased, thereby enabling synchronization in movement between the carbon nanotubes and the dispersing solvent, that is, ethanol.

(2) Patterning of Carbon Nanotubes Using the Prepared Dispersion.

The solution containing the carbon nanotubes, prepared according to the foregoing (1), was fed by droplets to a substrate maintained at 60° C. and evaporated to thus pattern the carbon nanotubes. More particularly, a method for patterning carbon nanotubes using a solution which contains carbon nanotubes coated with a polymer material may be generally classified into two types, that is: self-pinning such that a solution containing carbon nanotubes coated with a polymer material is evaporated due to a temperature of a substrate, enabling the carbon nanotubes (coated with the polymer material) to be precipitated and to pin movement of the solution; and compulsive pinning such that an evaporation guide provided on a substrate forcedly pins a solution, while carbon nanotubes coated with a polymer material is compulsively patterned along a shape of the evaporation guide. Such patterned nanomaterial coated with the polymer material may be sequentially immersed in a methanol solution then an ethanol solution for 30 to 60 seconds for each, to dissolve and remove the polymer material, thereby enabling the nanomaterial only to be patterned on the substrate.

FIG. 1 is a diagrammatic view illustrating an overall process of patterning a nanomaterial using solution evaporation according to the present invention.

FIG. 1A shows a process of patterning a nanomaterial using solution evaporation performed by self-pinning, characterized in that, when a solution containing carbon nanotubes coated with a polymer material is fed by droplets to a substrate having a bar shape evaporation guide provided thereon, the solution containing carbon nanotubes coated with a polymer material is evaporated along a shape of the evaporation guide due to a temperature of the substrate, thereby patterning the carbon nanotubes coated with a polymer material. In this case, the carbon nanotubes coated with the polymer material begins to be precipitated on a peripheral side of the solution at which the solution is first evaporated, to thus pin the solution and, at the same time, surface tension of the solution is increased due to evaporation of a solvent in the solution while decreasing an amount of the solution, in turn enabling the carbon nanotubes (coated with the polymer material) to be periodically patterned on another site. After such patterning is completed, the evaporation guide provided on the substrate is removed using tweezers, and the substrate is sequentially dipped in a methanol solution then an ethanol solution to dissolve and remove the polymer material applied to the carbon nanotubes, resulting in the substrate patterned with the carbon nanotubes.

FIG. 1B shows carbon nanotubes patterned by compulsive pinning, more particularly, a process of patterning the carbon nanotubes (coated with a polymer material) along a shape of an evaporation guide, characterized in that, when a solution containing carbon nanotubes coated with a polymer material is fed by droplets to a substrate surrounded by an evaporation guide, a solvent in the solution containing carbon nanotubes coated with a polymer material is evaporated only at a peripheral side of the evaporation guide due to a temperature of the substrate, thereby patterning the carbon nanotubes (coated with a polymer material) along the shape of the evaporation guide. In this case, the carbon nanotubes coated with the polymer material is first evaporated at a peripheral side of the evaporation guide and a Volume of the solution begins to be decreased in the center of the solution due to evaporation of the solvent in the solution and such volume decrease continues toward the peripheral side thereof, thereby enabling the carbon nanotubes (coated with the polymer material) to be patterned along a shape of the evaporation guide. After such patterning is completed, the evaporation guide provided on the substrate is removed using tweezers, and the substrate is sequentially dipped in a methanol solution then an ethanol solution to dissolve and remove the polymer material applied to the carbon nanotubes, resulting in the substrate patterned with the carbon nanotubes.

Figure 2:
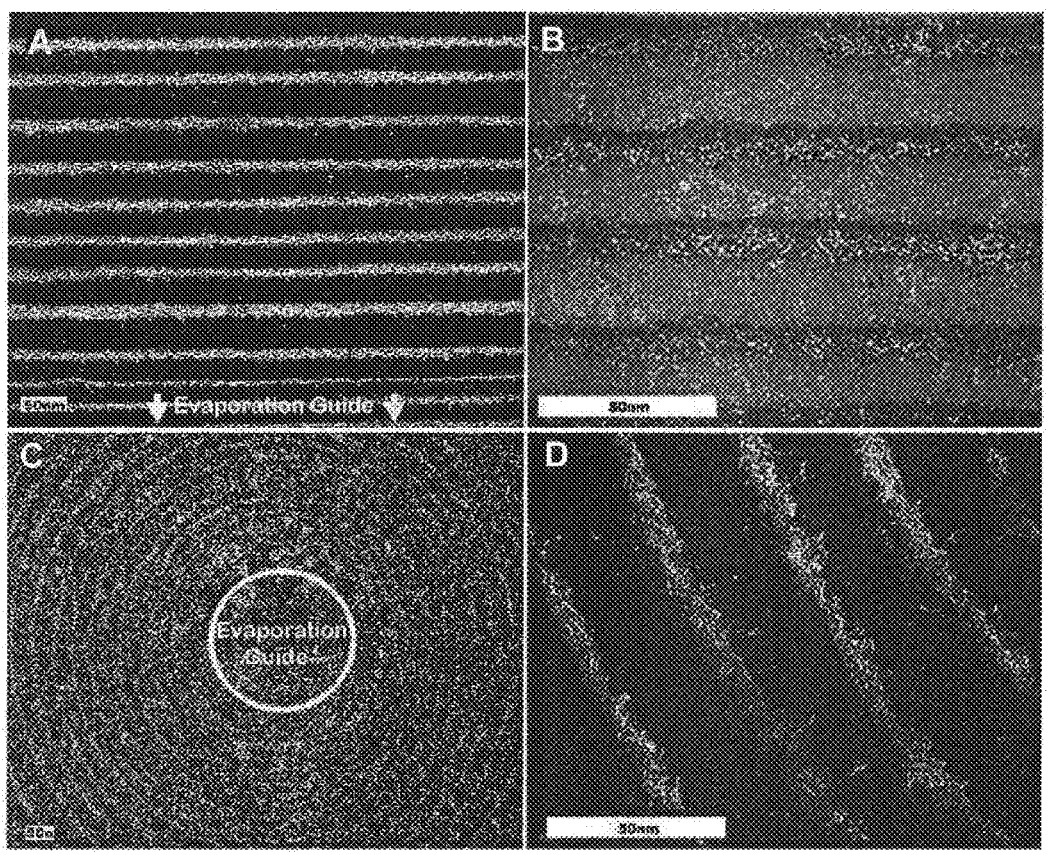
FIG. 2 shows scanning electron microscopy (SEM) images showing carbon nanotubes patterned by self-pinning, among methods for patterning a nanomaterial using solution evaporation. In particular.

FIG. 2 shows SEM images showing carbon nanotubes patterned by self-pinning, among methods for patterning nanomaterial using solution evaporation. In particular, FIG. 2A is an SEM image showing carbon nanotubes periodically patterned in a straight line form, FIG. 2B is an enlarged SEM image of a part shown in FIG. 2A, FIG. 2C is an SEM image showing carbon nanotubes patterned in a concentric form, and FIG. 2D is an enlarged SEM image of a part shown in FIG. 2C.

Figure 3:
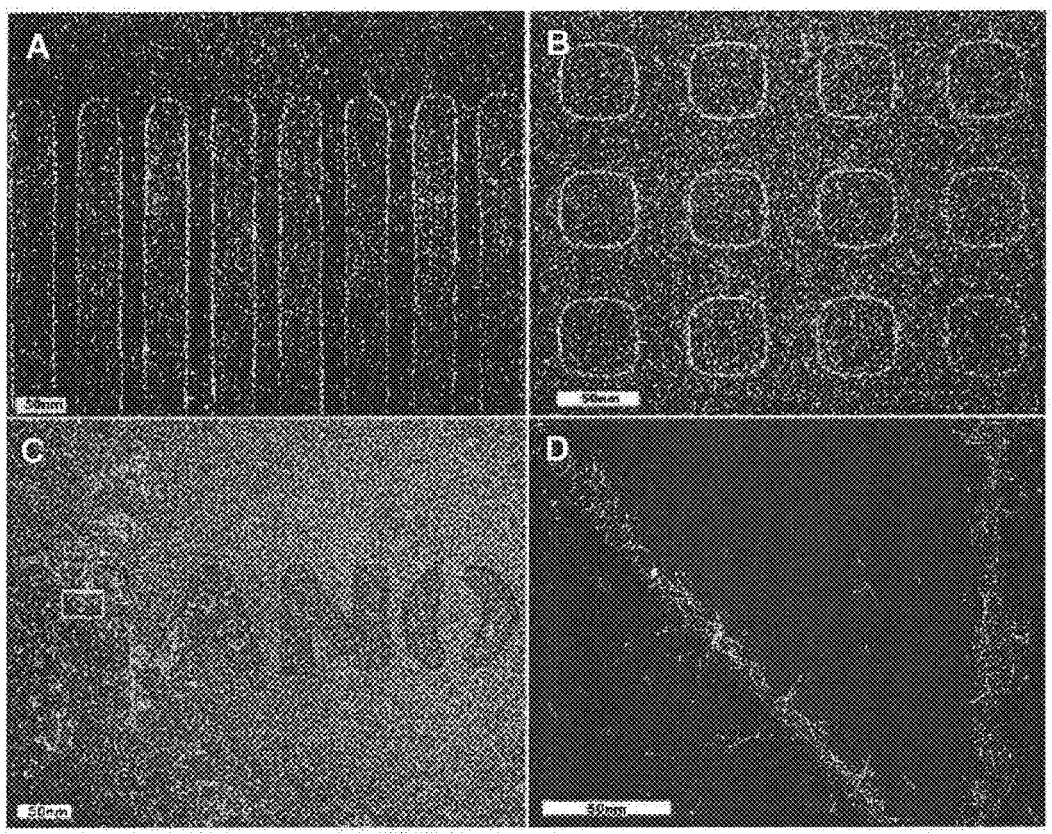
FIG. 3 shows SEM images showing carbon nanotubes patterned by compulsive pinning, among methods for patterning a nanomaterial using solution evaporation. In particular.

FIG. 3 shows SEM images showing carbon nanotubes patterned by compulsive pinning, among methods for patterning nanomaterial using solution evaporation. In particular, FIG. 3A is an SEM image showing carbon nanotubes periodically patterned in 'U' shape, FIG. 3B is an SEM image showing carbon nanotubes periodically patterned in 'U' shape, FIG. 3C is an SEM image showing carbon nanotubes patterned in a shape of word 'NANO,' and FIG. 3D is an enlarged SEM image of a white square part in the word 'NANO' shown in FIG. 3C.

Example 2

Patterning of Metal-Doped Carbon Nanotubes Using Solution Evaporation (1) Preparation of a Dispersion Containing Metal-Doped Carbon Nanotubes.

In order to prepare a dispersion containing metal-doped carbon nanotubes coated with a polymer material, 8 mg of metal (that is, platinum (Pt))-doped carbon nanotubes were placed in 50 ml of 1,5-pentanediol solution and dispersed using a sonicator for 6 hours. The dispersion containing the metal-doped carbon nanotubes was moved to a round flask and 5.35 g of polyvinyl pyrrolidone (PVP) was added thereto. Then, the mixture was heated at 200° C. for 2 hours under stirring, further heated by elevating the temperature to 270° C. for 30 minutes, followed by decreasing the temperature. Next, a series of processes including washing the material with 150 ml of acetone, dispersing the washed material in 50 ml of ethanol and centrifuging the dispersion to isolate carbon nanotubes were repeated twice. Thereafter, the resultant carbon nanotubes were dispersed again in 25 ml of ethanol to obtain a solution containing the metal-doped carbon nanotubes coated with the polymer material.

The metal-doped carbon nanotubes may be replaced by other carbon nanotubes doped with any one transition metal selected from a group consisting of gold (Au), iron (Fe), nickel (Ni) and cobalt (Co), other than Pt.

(2) Patterning of Metal-Doped Carbon Nanotubes Using the Prepared Dispersion.

The solution containing the metal-doped carbon nanotubes coated with the polymer material, prepared as described above, was fed by droplets to a substrate maintained at 60° C. and evaporated to thus pattern the carbon nanotubes. More particularly, a method for patterning a dispersion containing metal-doped carbon nanotubes coated with a polymer material is substantially the same as those described in the foregoing step (2) for patterning carbon nanotubes in Example 1.

Figure 4:
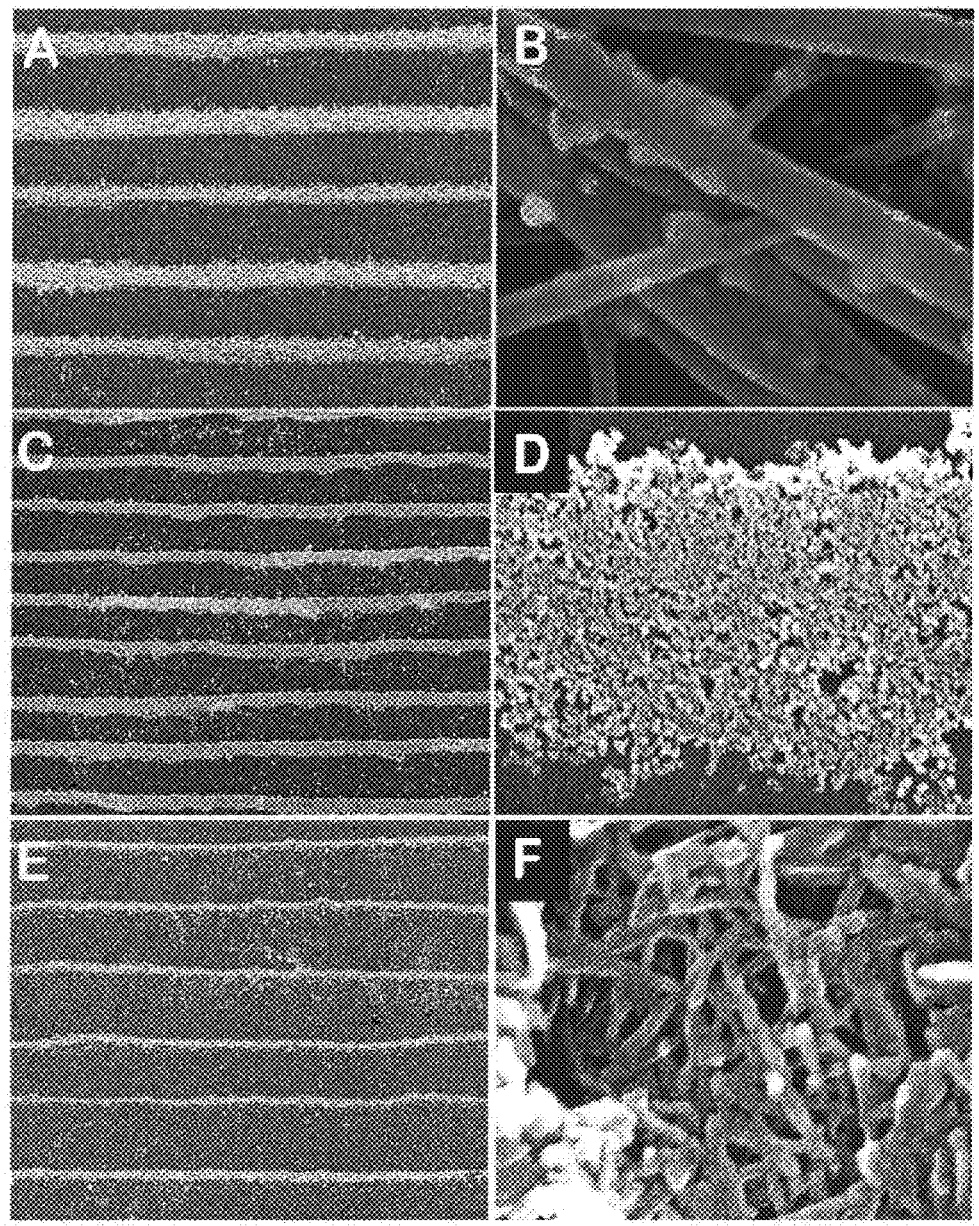
FIG. 4 shows SEM images showing metal-doped carbon nanotubes, titanium oxide nanoparticles and titanium oxide nanotubes, respectively, patterned using solution evaporation. In particular.

FIG. 4 shows SEM images of metal-doped carbon nanotubes patterned using solution evaporation. In particular, FIG. 4A is an SEM image showing metal-doped carbon nanotubes patterned using solution evaporation and FIG. 4B is an enlarged SEM image of a part shown in FIG. 4A.

Example 3

Patterning of Titanium Oxide Nanoparticles Using Solution Evaporation (1) Preparation of a Dispersion Containing Titanium Oxide Nanoparticles.

In order to prepare a dispersion containing titanium oxide nanoparticles coated with a polymer material, 8 mg of titanium oxide nanoparticles were placed in 50 ml of 1,5-pentanediol solution and dispersed using a sonicator for 12 hours. The dispersion was moved to a round flask and 5.35 g of polyvinyl pyrrolidone (PVP) was added thereto. Then, the mixture was heated at 200° C. for 2 hours under stirring, further heated by elevating the temperature to 270° C. for 30 minutes, followed by decreasing the temperature. Next, a series of processes including washing the material with 150 ml of acetone, dispersing the washed material in 50 ml of ethanol and centrifuging the dispersion to isolate titanium oxide nanoparticles were repeated twice. Thereafter, the resultant product was dispersed again in 30 ml of ethanol to obtain a solution containing the titanium oxide nanoparticles coated with the polymer material.

(2) Patterning of Titanium Oxide Nanoparticles Using the Prepared Dispersion.

The solution containing the titanium oxide nanoparticles coated with the polymer material, prepared as described above, was fed by droplets to a substrate maintained at 60° C. and evaporated to thus pattern the titanium oxide nanoparticles. More particularly, a method for patterning a dispersion containing titanium oxide nanoparticles coated with a polymer material is substantially the same as those described in the foregoing method for patterning the carbon nanotubes.

FIG. 4 shows SEM images of titanium oxide nanoparticles patterned using solution evaporation. In particular, FIG. 4C is an SEM image showing titanium oxide nanoparticles patterned using solution evaporation and FIG. 4D is an enlarged SEM image of a part shown in FIG. 4C.

Example 4

Patterning of Titanium Oxide Nanotubes Using Solution Evaporation (1) Preparation of a Dispersion Containing Titanium Oxide Nanotubes.

In order to prepare a dispersion containing titanium oxide nanotubes coated with a polymer material, 6 mg of titanium oxide nanotubes were placed in 50 ml of 1,5-pentanediol solution and dispersed using a sonicator for 4 hours. The dispersion was moved to a round flask and 5.35 g of polyvinyl pyrrolidone (PVP) was added thereto. Then, the mixture was heated at 200° C. for 2 hours under stirring, further heated by elevating the temperature to 270° C. for 30 minutes, followed by decreasing the temperature. Next, a series of processes including washing the material with 150 ml of acetone, dispersing the washed material in 50 ml of ethanol and centrifuging the dispersion to isolate titanium oxide nanotubes were repeated twice. Thereafter, the resultant product was dispersed again in 10 ml of ethanol to obtain a solution containing the titanium oxide nanotubes coated with the polymer material.

(2) Patterning of Titanium Oxide Nanotubes Using the Prepared Dispersion.

The solution containing the titanium oxide nanotubes coated with the polymer material, prepared as described above, was fed by droplets to a substrate maintained at 60° C. and evaporated to thus pattern the titanium oxide nanotubes. More particularly, a method for patterning a dispersion containing titanium oxide nanotubes coated with a polymer material is substantially the same as those described in the foregoing method for patterning the carbon nanotubes.

FIG. 4 shows SEM images of titanium oxide nanotubes patterned using solution evaporation. In particular, FIG. 4E is an SEM image showing titanium oxide nanotubes patterned using solution evaporation and FIG. 4F is an enlarged SEM image of a part shown in FIG. 4E.

According to the present invention, a method for patterning nanomaterials having a controlled shape and size performed by a simple process at a low cost may be provided. Using a nanomaterial, the present invention may attain industrial applicability as well as utility in a variety of applications.

According to the method for patterning a nanomaterial of the present invention, electrical, optical and/or magnetic properties of nano-sized materials may be effectively used to fabricate ultrafine electronic elements.

Although preferred embodiments of the present invention have been described for illustrative purposes, those skilled in the art will appreciate that various alterations and modification are possible, without departing from the scope and spirit of the present invention as disclosed in the appended claims.

What is claimed is:

1. A method for patterning a nanomaterial using solution evaporation, the method comprising:
    coating the nanomaterial with a polymer material and uniformly dispersing the coated nanomaterial in a solvent to prepare a solution containing the nanomaterial; and
    pouring the nanomaterial-containing solution on a substrate, enabling the nanomaterial to be patterned after evaporation of the solvent,
    wherein the coating includes:
    dispersing the nanomaterial in 1,5-pentanediol and adding at least one selected from the group consisting of polyvinyl pyrrolidone (PVP), polystyrene, poly(vinyl acetate) and polyisobutylene as the polymer material to the dispersion,
    first-heating the solution at 150° C. to 230° C. for one hour to three hours while agitating, and second-heating the resultant material by elevating the temperature to 250° C. to 300° C. for 30 minutes to one hour, thereby coating the nanomaterial with the polymer material.

2. The method according to claim 1, wherein the solvent is at least one selected from a group consisting of ethanol, acetone, benzene, ether and hexane.

3. The method according to claim 1, wherein the solution containing the nanomaterial is maintained at a temperature ranging from 40 to 80° C. and fed to a substrate having an evaporation guide, enabling the nanomaterial to be patterned after evaporation of the solvent.

4. The method according to claim 1, wherein the nanomaterial is any one selected from a group consisting of carbon nanotubes, metal-doped carbon nanotubes, titanium oxide nanoparticles and titanium oxide nanotubes.

5. The method according to claim 3, wherein the evaporation guide is made of at least one selected from a group consisting of ceramic, glass and metal.

6. The method according to claim 3, wherein the evaporation guide is fabricated in at least one shape selected from a group consisting of a straight line, curve, circle and angled shapes.

* * * * *